United States Patent

Ezaki

[15] 3,671,811

[45] June 20, 1972

[54] DIODE MATRIX CARD

[72] Inventor: Joichiro Ezaki, Funabashi, Japan

[73] Assignee: TDK Electronics Company, Limited, Tokyo, Japan

[22] Filed: June 30, 1971

[21] Appl. No.: 158,453

Related U.S. Application Data

[63] Continuation-in-part of Ser. No. 856,058, Sept. 8, 1969, abandoned.

[30] Foreign Application Priority Data

Sept. 16, 1968 Japan....................................43/80727

[52] U.S. Cl.........................317/101 D, 317/101 CE, 340/174

[51] Int. Cl...........................................................H05k 1/04

[58] Field of Search.................317/101 CM, 101 CE, 101 D; 340/174 MA, 174 GP, 174 NC

[56] References Cited

UNITED STATES PATENTS 3,245,059 4/1966 Eiseman et al..................340/174 NC 3,439,109 4/1969 Brit et al............................317/101 D 3,087,096 4/1963 Jorgensen..........................317/101 D

*Primary Examiner*—David Smith, Jr.

[57] ABSTRACT

A coupling system of the diode matrix card to the memory assembly plane. The diode matrix card including a number of diodes loaded at a high density on a surface of an insulating base board and a printed circuit for inter connecting on the other surface selective ones of the diodes, as well as a grounding pattern plated on at least a surface of the boards as spaced from the printed circuit, is provided with a pair of connector-pin groups on a base board surface respectively connected to the printed circuit. A pair of separate connector means are preliminarily mounted to the memory assembly plane so as to be connected to memory driving lines in the memory matrix. A pair of grounding frame means are also mounted to the assembly plane substantially at the same position as the connector means. The diode matrix card is mounted to the grounding frame means with fixing screws so that the grounding pattern and the connector pin groups on the card are electrically connected to the grounding means and the connector means on the assembly plane side simultaneously.

4 Claims, 14 Drawing Figures

INVENTOR
JOICHIRO EZAKI
BY
Wolfe, Hubbard, Voit & Osann
ATTORNEYS

INVENTOR
JOICHIRO EZAKI
BY
Wolfe, Hubbard, Voit & Osann
ATTORNEYS

INVENTOR
JOICHIRO EZAKI
BY
Wolfe, Hubbard, Voit & Osann
ATTORNEYS

INVENTOR
JOICHIRO EZAKI

BY
Wolfe, Hubbard, Leydig, Voit & Osann, Ltd.
ATTORNEYS

DIODE MATRIX CARD

CROSS-REFERENCE TO RELATED APPLICATION

The present application is a continuation-in-part of Ezaki Application Ser. No. 856,058, filed Sept. 8, 1969, for "Diode Matrix Card", which is now abandoned.

This invention relates generally to a structure of of memory stack and, more particularly, to a coupling system in the memory stack for establishing mechanical coupling and simultaneous electrical connection of the diode metrix card on which a number of diodes are compactly loaded to the memory assembly plane.

Generally, in 2½ Dimensional Memory System, an independent bit driving is adopted as differed from 3 Dimensional Memory System and, consequently, the number of diodes in the diode matrix has to be so large that connecting lines for these diodes are increased and become complicated. While in the 2½ D. memory system the respective drive wires of the respective bits in the same assembly plane mat are not to be driven simultaneously, the driving current for other mat will cause the sense center potential of a bit not driven by the current to remarkably rise or fall with respect to ground potential. Such potential variation influences the read-out output as being a differential mode. The present invention has been suggested to eliminate such defects as above in the conventional art, that is, to rationalize the arrangement of components for and the structure of the diode matrix card so that electrical connection between the card and the memory assembly plane will become complete and thereby any undesirable induction from other bit will be prevented.

A primary object of the present invention is, therefore, to provide a coupling system in the memory stack of the diode matrix card on which a number of diode is effectively mounted at a high density as well as connector members therefor to the memory assembly plane, so as to make the whole memory stack to be compact and mechanical coupling and electrical connecting operations of the card to the memory assembly plane to be easily established in a simultaneous and complete meanner.

A further object of the present invention is to provide a memory stack of which characteristics are improved by providing a complete grounding system in the memory stack between the surface grounding pattern and the earthing means in the memory assembly plane so as to maintain the pattern to be ground potential.

Other objects and advantages of the invention will become apparent as the following description proceeds, taken in conjunction with the accompanying drawings in which.

The present invention shall now be described with reference to an embodiment of the invention illustrated, but it will be understood that the description is not to limit the invention to the particular embodiment but rather to include all of modifications, alterations and equivalents to be covered by the appended claims.

Figures 1A, 1B:
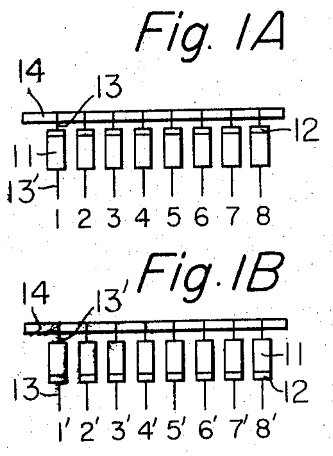
FIGS. 1A and 1B show respective elevations of two kinds of diode groups, respectively arranged according to the present invention.

In FIGS. 1A and 1B, 11 is a diode, 12 is its anode mark and 13 and 13′ are lead wires for the respective diodes 11. As will be seen, the diodes are arranged in the same direction and are connected in parallel relation to each other at one side of, in the case of FIG. 1A, lead wires 13 or, in the case of FIG. 1B, lead wires 13′. It will be preferable to use a rectangular wire 14 for connecting the wires 13 or 13′ by welding the latter to the wire 14. The respective diodes are arranged parallelly at regular intervals with each other.

With such arrangement of the diode, it will become possible to mount a number of diode vertically to a matrix card or base plate in a close relation to each other so that the diodes are assembled on the card at a higher density.

Figure 2A:
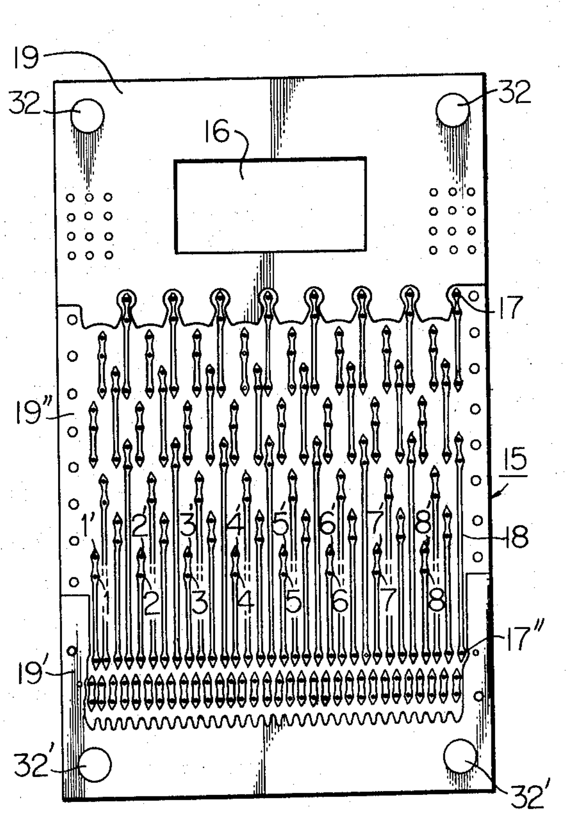
FIG. 2A shows a front surface of a printed circuit board of the diode matrix card as a component of the present invention.
Figure 2B:
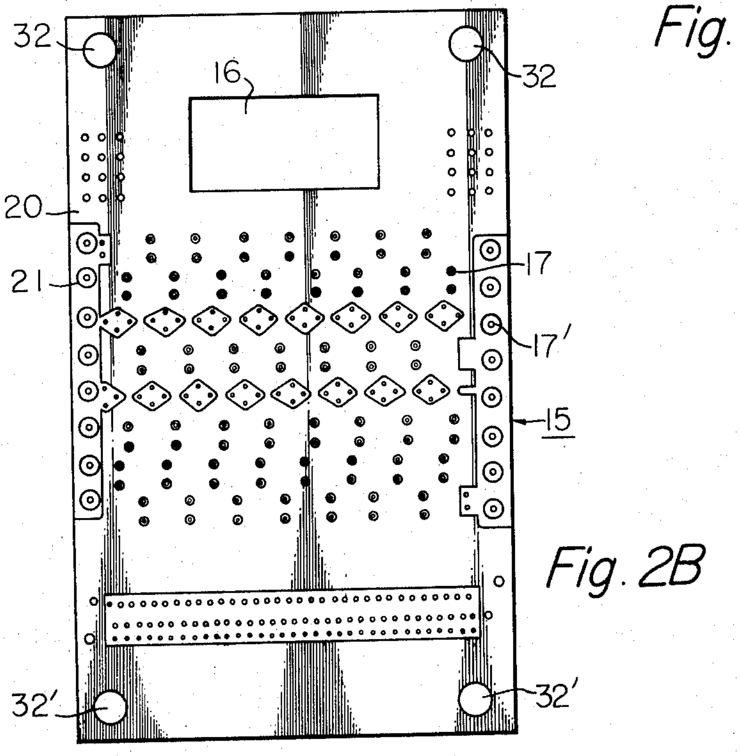
FIG. 2B shows a back surface of the board in FIG. 2A.

FIG. 2A shows a front surface of a printed circuit board 15 of the diode matrix card and FIG. 2B shows a back surface of the same. On the front surface, as in FIG. 2A, a rectangular window 16 is made in the upper part and many holes 17 for passing lead wires of the diodes are made below the window in a plurality of rows. A plated part 18 for connection between predetermined ones of said holes 17 is provided around the holes and to extend from one to the other so as to form a printed circuit. As insulated from such printed circuit 18, ground patterns 19 and 19′ for grounding are plated respectively on the upper and lower portions of the surface. 19″ represents a part not plated of the board 15. On the back surface shown in FIG. 2B, a ground pattern 20 for grounding is provided as spaced from the respective holes 17. Around respective ones of the holes 17′ made along side edges, plated parts 21 for connection are formed on the plate 15 as separated from the ground pattern 20. 32 and 32′ are holes for mounting the card to the memory assembly plane unit and respectively made at the corners of the card at the position where each of the holes penetrates through the ground patterns 19 and 20 or 19′ and 20 on the both surfaces of the board 15.

Figure 5:
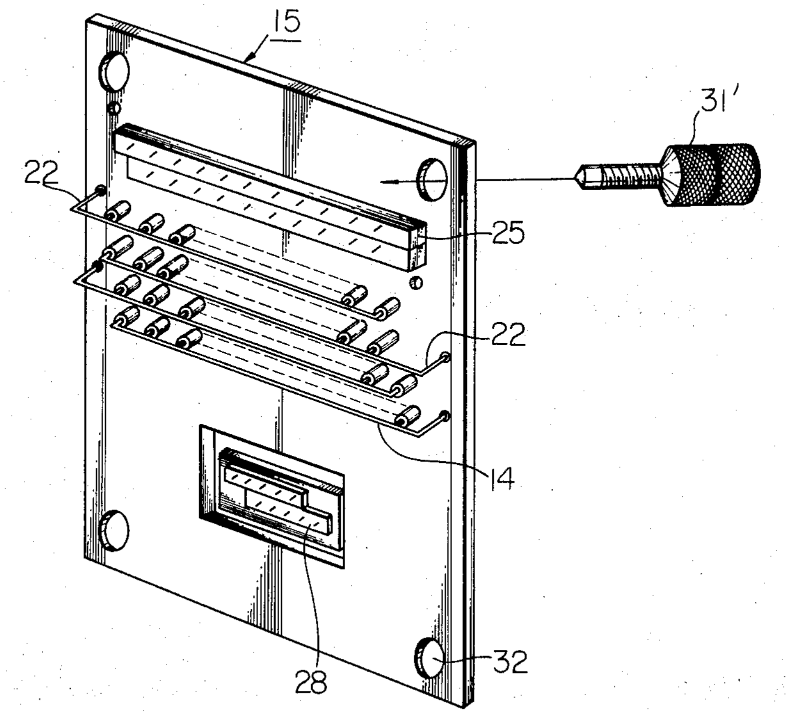
FIG. 5 is a perspective view of the diode matrix card of the present invention.

When the diode group shown in FIGS. 1A and 1B is to be assembled to the printed circuit board in FIG. 2, each lead wire 13′ (the ones not welded to the rectangular wire 14) in the case of the diode 11 as shown in FIG. 1A is inserted from the back side (shown in FIG. 2B) of the printed circuit board 15 and is soldered to the plated part 18 for connection on the front side (shown in FIG. 2A). In such case, the lead wires indicated with reference numrals 1, 2, 3, . . . and 8 in FIG. 1A are inserted respectively into the holes 1, 2, 3, . . . and 8 in FIG. 2A and the lead wires 1′, 2′, 3′, . . . and 8′ in FIG. 1B are inserted into the holes 1′, 2′, 3′, . . . and 8′ in FIG. 2B. Thus each diode is connected through the connecting plated part 18 provided on the printed circuit board 15. In such case, each rectangular wire 14 is soldered at one end to a pillar 22 provided upright in the side part of the printed circuit board so that while the diode group are arranged on the back surface (FIG. 2B) of the printed circuit board 15 (See FIG. 5), all of the diode terminals will be accessible on the front side of the card.

Figure 3A:
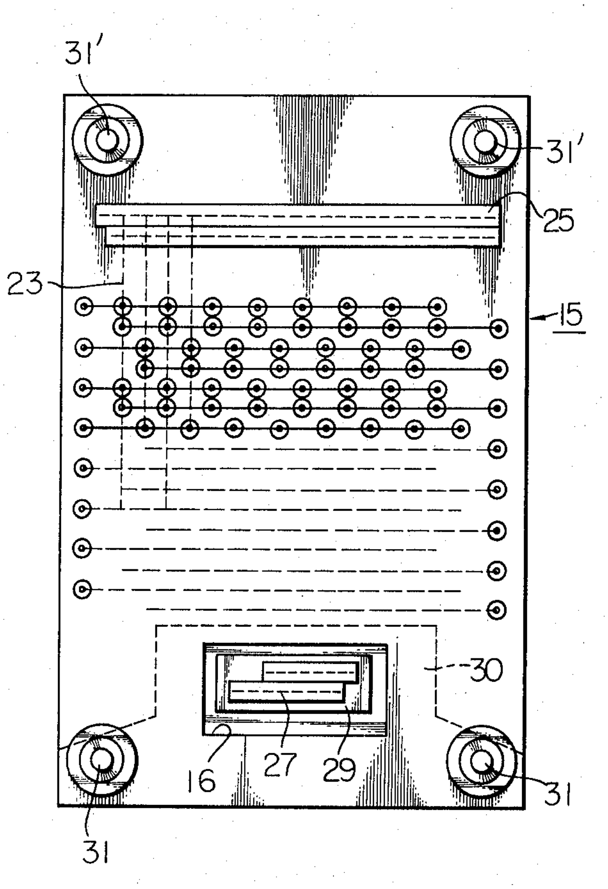
FIG. 3A is an elevation of the diode matrix card in the present invention
Figure 3B:
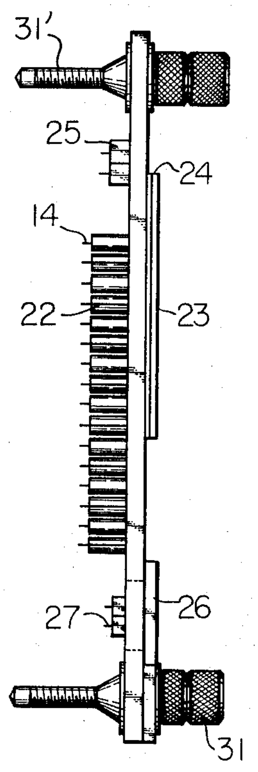
FIG. 3B is a side view of the same.
Figure 4A:
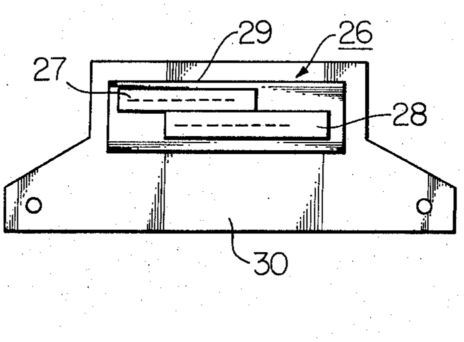
FIG. 4A is an elevation of a terminal frame to be used in the diode matrix card and FIG. 4B is a side view of the same.
Figure 4B:
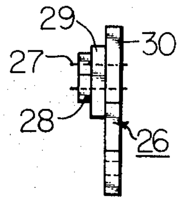

In order to perform electric connection between the diodes on the board 15 and the memory assembly plane, the printed board 15 is provided with a first group of connectors 24, each of which is formed by inserting connector pins through an insulator 25 fixed on the board. Substantially half of the pins of connectors 24 in the present embodiment is passed at one end respectively through holes 17″ made in the printed circuit board 15 and soldered to the plated part 18 around said holes 17″ on the front surface of the printed circuit board 15, so as to fix the connectors 24 to the board 15 and at the same time to connect them to selected ones of the diodes through the printed circuit 18. Further, the rest half of connector pins of the connectors 24 are connected to substantially the rest half of the diodes 11 through lead wires or conductor bars 23 on the front surface of the board as shown with broken lines in FIG. 3A and with a side view of FIG. 3B.

A second group of connectors in the form of a terminal frame 26 is provided on the board, in which connector pins 27 are inserted through insulator bars 28 and soldered at one end through an insulator plate 29 to plated parts formed around holes for receiving the respective end of the connector pins made in a further insulator plate 30. The terminal frame 26 is fixed to the printed circuit board 15 at the time when the board 15 is mounted to the memory assembly plane with a fixing screw 31 fitted into each hole 32 made in the circuit board 15, in such manner that the connector pins 27 will be arranged on the same side as of the diode group. Further fixing screw 31′ are placed in holes 32′ at the other end of the board 15, which screws are utilized solely for fixing the board 15 to the memory assembly plane.

Further for the electric connection and also for performing the mechanical coupling of the above described diode matrix card to the memory assembly plane, the latter is provided with a pair of separate connector means and a pair of grounding means.

Figures 6, 7, 8, 9, 10:
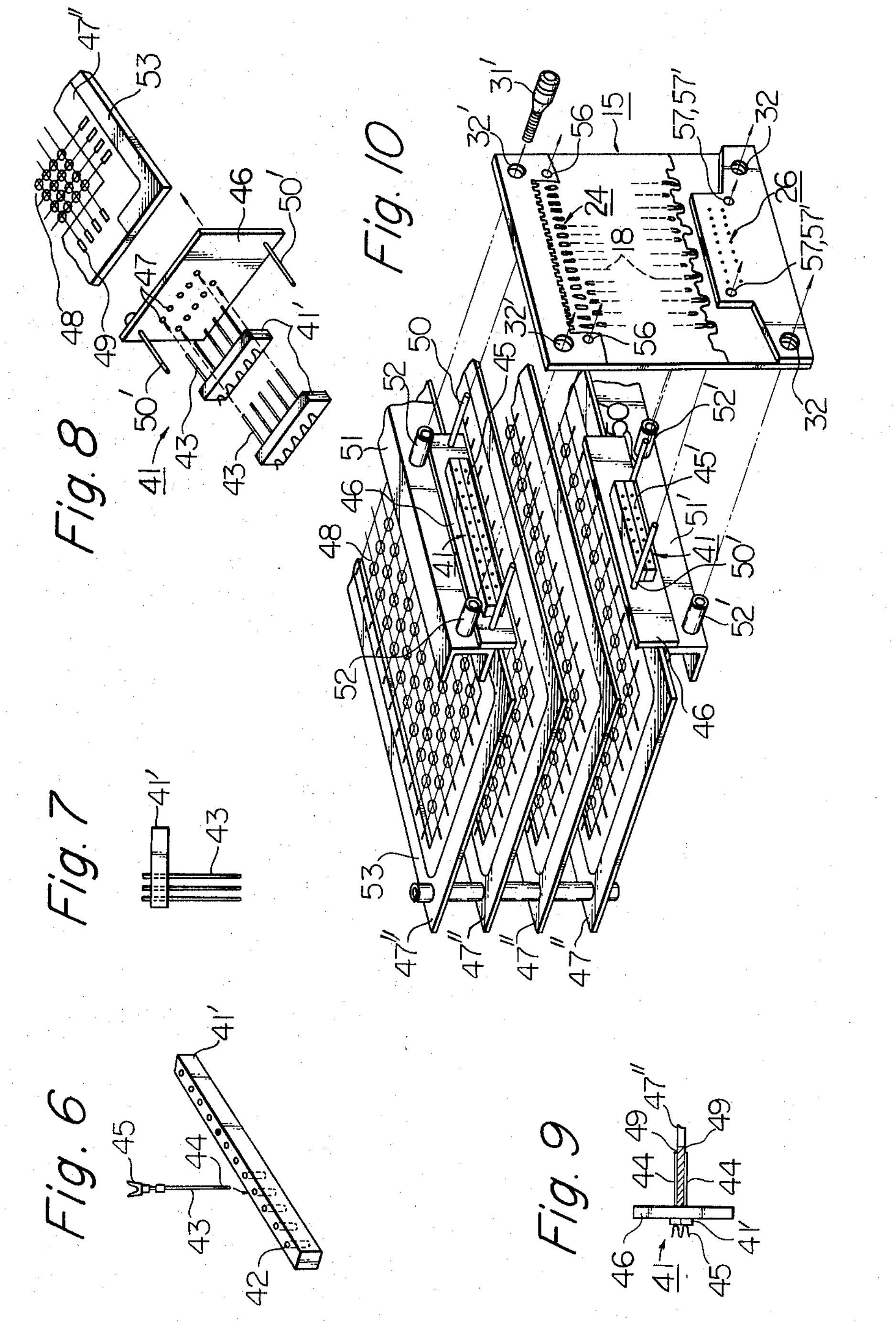
FIG. 6 is a perspective view of a connector means for electric connection of the diode matrix card to the memory assembly plane, showing respective elements as disassembled.
FIG. 7 is a plan view of the connector means of FIG. 6 partly assembled.
FIG. 8 is a perspective view showing assembly operation of the connector means and a memory assembly plane mat.
FIG. 9 is a side view of the connector means and the mat as assembled.
FIG. 10 is a perspective view showing coupling operation of the memory assembly plane and the diode matrix card.

In the particular embodiment, a pair of connector means 41 is provided so as to correspond to the above described first and second groups of connectors 24 and 26. As shown in FIGS. 6 and 7, a plurality of connector pins 43 respectively having an extended tale end 44 and contacting head 45 is inserted into a plurality of holes 42 made in an insulator bar 41′. Two of such bars 41′ having the pins 43 arranged side by side in two rows are fixed onto an insulator plate 46 so that the extended ends 44 will penetrate through two rows of holes 47 and 47′ in the plate 46, as shown in FIG. 8. The extended ends 44 of such connector pins 43 in two upper and lower rows are respectively brought into contact with printed patterns 49 on both upper and lower surfaces of a frame 47″ of a memory assembly plane mat 48, of which proper driving lines or wires are connected to said pattern 49, and the pins 43 are soldered to the patterns so that the driving lines in the mat 48 will be respectively accessible at the contacting head side 45 of the connector or means 41 through the printed patterns on the both sides as shown in FIG. 9. 50 and 50′ are a pair of guide pins fixed to the insulator plate 46 penetrating therethrough.

FIG. 10 shows how the diode matrix card 15 of the present invention is coupled to the memory assembly plane to which the above described separate connector means 41 is mounted.

A plurality of the frames 47″ of the memory assembly plane mat including respectively a proper number of core memories and assembly lines is arranged in a pile as regulary spaced parallely from each other and fixed by means of a proper bolt penetrating through the pile. A pair of the connector means 41 is fixed to the upper most and lowermost frames 47″ in the manner shown in FIG. 9, respectively, and a pair of such a grounding means as, for example, a metallic angle bar 50 or 50′ of an L or U shape (in the illustrated embodiment a U-shaped bar is used) is fixed likewise to the uppermost and lowermost frames 47″ of the assembly plane so as to be in electrical contact with printed ground patterns 53 on the upper and lower surfaces of the uppermost and lowermost frames 47″, respectively. In this case, the printed connection pattern 49 for the driving lines of the mat 48 as well as the connector pins 43 should be naturally insulated from the angle bars 50 and 50′. On the outer side surface of each angle bar 50 or 50′, a pair of retractors 52 or 52′ of conductive material having a threaded hole respectively is fixed for mounting the card 15 thereto. Such retractors 52 and 52′ may be replaced by a simple threaded hole made in the grounding means 51 and 51′, but the form of retractor will be preferable in view of stable fixing or mounting of the card with a predetermined space between the card and the assembly plane. The card 15 is mounted to the plane so that the guide pins 50 and 50′ of the connector means 41 will engage in holes 56 and 57 made in the card 15, and the fixing screws 31 and 31′ are screwed into the retractors 52 and 52′ through the holes 32 and 32′ in the card 15, thereby the card 15 is fixed to the memory assembly plane. At this time, the respective connector pins in the pair of connectors 24 and 26 on the card 15 and in the pair of connector means 41 opposing to each other are simultaneously brought into engagement and thereby the desired electric circuit between the diodes on the card and the driving lines in the memory assembly plane will be established at the same time with the mounting. Further at this time, the printed ground patterns 19 and 20 and 19′ and 20 on the both surfaces of the card 15 are also electrically connected to the ground patterns 53 on the mat-frames 47″ through the fixing screws 31 and 31′ retractors 52 and 52′ and angle bars 51 and 51′ brought into contact with the pattern 53, so that the whole assembly will maintain the ground potential, thereby the sense line center potential of the bit not driven by a driving current is prevented from being remarkably raised or fallen with respect to the ground potential and consequently a low impedance effect is established with respect to the core memory and assembly driving lines.

According to the present invention, it is made possible to readily perform the mounting and simultaneous electrical connecting operations between all components in the memory stack specifically of 2½ Dimension Memory System since, as described above, the memory assembly plane is arranged in such that the grounding angle members are mounted to the uppermost and lowermost assembly plane mat-frames parallelly piled up, a pair of connector means including connector pins respectively connected at one end to the memory driving line and exposed at the other end for easy access is preliminarily mounted to said uppermost and lowermost mat-frames, and a guide member is also provided in the connector means, and on the other hand the diode matrix card to be assembled to the above memory assembly plane is arranged in such that a larger number of diodes is vertically mounted onto the card at a high loading density, two groups of connectors for easy access to interconnected groups of said diodes by a printed circuit on the card and to the memory driving lines from outside the card are arranged on the card in opposing positions to the pair of connector means on the memory assembly plane, printed ground patterns are provided on both surfaces of the card with the largest area utilizing the larger space provided by the compact and effective arrangement of the diodes and printed circuit therefor, and holes are provided for engaging said guide member and receiving fixing screws at position where both surface ground patterns are electrically connected by the passed-through screws. Thus, the mechanical coupling and electrical connection of the diode matrix card to the memory assembly plane become easy and yet reliably stable and the memory stack as a whole can be made compact.

Further according to the present invention, such advantageous effects as follows in the electrical performances of the memory stack can be achieved by the arrangement of respective components as described in the foregoing. That is, since many diodes are vertically mounted to the diode matrix card having a printed ground pattern so as to be in a plurality of rows and the diodes in each row are parallelly connected at the lead wire position so as to be one group, specifically when the memory stack is driven in the 2½ dimensional system, the potential at the lead wire position of said group of diodes is maintained at the same potential while only one of the diodes in the group is fed a driving current, so that the potential of other driving lines in the same assembly plane mat is not undesirably influenced. Further, since the respective groups of many diodes are effectively connected to the easy accessible connectors by the printed circuit through the shortest distance, a large space on the card surfaces is provided for arranging a sufficiently larger ground pattern, so that any undesired influences due to an induction or the like to other printed circuitry pattern from a particular pattern to which the current is fed will be blocked, and the memory assembly plane mat is also prevented from being influenced by such current flown through the printed pattern.

What is claimed is:

1. In the memory stack comprising the memory assembly plane and the diode matrix card, a coupling system comprising a combination of a pair of grounding means respectively arranged onto the uppermost and lowermost position of said memory assembly plane, a pair of connector means respectively provided to oppose to each of said grounding means and connected to driving lines of the matrix, a diode matrix card having on a surface of an insulative base plate a group of diodes arranged in a plurality of rows as vertically mounted, a ground pattern insulated from said group of diodes, and a pair of connectors respectively opposing to each of said pair of gounding means, and on the other surface a printed circuit to electrically connect a predetermined group of said diodes to one of said pair of connectors, a plurality of conductive bars to electrically connect the other predetermined group of said diodes to the other one of the connectors, and a ground pattern separated from said printed circuit, said diode matrix card further having at least a pair of mounting holes at positions to penetrate through said ground patterns on both surfaces of the card and to oppose to each of said pair of grounding means, and at least a pair of fixing screws to be inserted through said mounting holes for fixing the card to said grounding means, so that when the diode matrix card is fixed to the grounding means by said fixing screws desired electric circuit and grounding circuit between the memory assembly plane and the diode matrix card are simultaneously established through said opposing connector means and connectors and said fixing screws.

2. In the memory stack comprising the memory assembly plane and the diode matrix card, a coupling system comprising a combination of a plurality of frame-mats for the memory assembly plane piled up in parallel relation to each other and respectively having along peripheral outer edges a surface grounding pattern and along inner edges a printed connection pattern connected to a desired number of memory-driving lines, a pair of grounding angle-bars respectively fixed onto the uppermost and lowermost ones of said frame-mats as electrically connected to said grounding pattern of the mats and having at least one threaded hole for mounting the diode matrix card, a pair of connector means respectively comprising an insulative plate mounted to each said grounding angle-bar and a plurality of connector pins penetrating vertically through said insulative plate to be electrically connected to said printed connection pattern on the frame-mat, a diode matrix card including on one surface of an insulative base plate a group of diode vertically mounted to said base plate and of a corresponding number to the memory-driving lines, a grounding pattern separated from said group of diodes, and a pair of connector-pin groups respectively of a corresponding number to said connector pins in the respective connector means and vertically mounted to the base plate as insulated from said grounding patern at opposing positions to the connector pins in the connector means, and on the other surface of said base plate a printed circuitry pattern to electrically interconnect between a group of terminals of a polarity led out from the group of diodes and one of said pair of connector-pin groups, a plurality of conductor bars to electrically interconnect between the other group of the diode terminals of the other polarity and the other one of said pair of connector-pin groups, and a grounding pattern separated from said printed circuitry pattern, said diode matrix card further having at least a pair of mounting holes at positions opposing to said threaded holes in the grounding angle-bars and penetrating through the grounding patterns on both surfaces of the card, and at least a pair of fixing screws for inserting through respective said mounting holes in the diode matrix card and screwing into said threaded holes in the grounding angle-bars, thereby the diode matrix card will be mounted to the angle-bars, the arrangement being such that, at the same time when the diode matrix card is mounted, the memory-driving lines on said memory assembly plane and the group of diodes corresponding to these lines on the diode matrix card are respectively connected to each other through said groups of connector-pins on said pair of connector means and said groups of connector-pins on the diode matrix card as coupled together, and the both grounding patterns on both surfaces of the diode matrix card are electrically connected to each other by means of the mounting screws inserted to the mounting holes in the card, and also to the grounding patterns on the memory assembly plane frame-mats through the mounting screws and the grounding angle-bars.

3. In the memory stack comprising the memory assembly plane and the diode matrix card, a coupling system comprising a combination of a plurality of frame-mats for the memory assembly plane piled up in parallel relation to each other and respectively having along peripheral outer edges a surface grounding pattern and along inner edges a printed conncection pattern connected to a desired number of memory-driving lines, a pair of substantially U-shaped grounding angle-bars respectively fixed onto the uppermost and lowermost ones of said frame-mats as electrically connected to said grounding pattern of the mats and having at least one threaded hole for mounting the diode matrix card, a pair of connector means respectively comprising an insulative plate mounted to each said grounding angle-bar and a plurality of connector pins penetrating vertically through said insulative plate to be electrically connected to said printed connection pattern on the frame-mat, said connector means having respectively at least a guide member extruding from a side opposite to the memory assembly plane, a diode matrix card including on one surface of an insulative base plate a group of diode vertically mounted to said base plate in a plurality of rows and of a corresponding number to the memory-driving lines, a grounding pattern separated from said group of diodes, and a pair of connector-pin groups respectively of a corresponding number to said connector pins in the respective connector means and vertically mounted to the base plate as insulated from said grounding patern at opposing positions to the connector pins in the connector means, and on the other surface of said base plate a printed circuitry pattern to electrically interconnect between a group of terminals of a polarity led out from the group of diodes and one of said pair of connector-pin groups, a plurality of conductor bars to electrically interconnect between the other group of the diode terminals of the other polarity and the other one of said pair of connector-pin groups, and a grounding pattern separated from said printed circuitry pattern, said diode matrix card further having at least a pair of mounting holes at positions opposing to said threaded holes in the grounding angle-bars and penetrating through the grounding patterns on both surfaces of the card and at least a pair of engaging holes at corresponding positions to said guide members in the pair of connector means for engaging the members therein, and at least a pair of fixing screws for inserting through respective said mounting holes in the diode matrix card and screwing into said threaded holes in the grounding angle-bars, thereby the diode matrix card will be mounted to the angle-bars, the arrangement being such that, when the diode matrix card is mounted to the memory assembly plane, the extruded guide members of the connector means are inserted to the corresponding engaging holes in the card so as to guide the latter to the predetermined mounting position, the memory-driving lines on said memory assembly plane and the group of diodes corresponding to these lines on the diode matrix card are respectively simultaneously connected to each other through said groups of connector-pins on said pair of connector means and said groups of connector-pins on the diode matrix card as coupled together, and the both grounding patterns on both surfaces of the diode matrix card are electrically connected to each other by means of the mounting screws inserted to the mounting holes in the card, and also to the grounding patterns on the memory assembly plane frame-mats through the mounting screws and the grounding angle-bars.

4. A coupling system for the memory assembly plane and the diode matrix card according to claim 3, wherein said printed connection pattern for memory-driving lines on the frame-mat is provided on each of upper and lower surfaces of the mat for connection to desired driving lines, respectively, said connector-pins in said pair of connector means are arranged in two upper and lower rows, the upper row of which being at corresponding position to said printed connection pattern on the upper surface of the mat and the lower row of which being at corresponding position to said printed connection pattern on the lower surface of the mat, and said pair of connector-pin groups on the diode matrix card are respectively arranged in two upper and lower rows so as to oppose respectively to said upper and lower rows of the connector-pins in the pair of connector means, so that when the memory stack is assembled the connector-pins on the diode matrix card are respectively coupled to opposing connector-pins in the connector means for electric connection, thereby a desired electric circuit of the memory stack is simultaneously established.

* * * * *